United States Patent
Lemus et al.

(10) Patent No.: US 6,990,030 B2
(45) Date of Patent: Jan. 24, 2006

(54) MAGNETIC MEMORY HAVING A CALIBRATION SYSTEM

(75) Inventors: Connie Lemus, Boise, ID (US);
Kenneth Kay Smith, Boise, ID (US);
Frederick A. Perner, Palo Alto, CA (US); Robert Sesek, Meridian, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 128 days.

(21) Appl. No.: 10/690,249

(22) Filed: Oct. 21, 2003

(65) Prior Publication Data

US 2005/0083748 A1 Apr. 21, 2005

(51) Int. Cl.
*G11C 7/02* (2006.01)
*G11C 7/04* (2006.01)

(52) U.S. Cl. ............... 365/209; 365/208; 365/211; 365/213

(58) Field of Classification Search ............ 365/213, 365/209, 211, 158, 171, 173, 205, 207, 208
See application file for complete search history.

(56) References Cited

U.S. PATENT DOCUMENTS

| 5,500,547 | A | 3/1996 | Yamaguchi et al. |
| 5,828,263 | A | 10/1998 | Gantioler et al. |
| 5,869,878 | A | 2/1999 | Hasegawa |
| 6,225,871 | B1 | 5/2001 | Chien |
| 6,233,190 | B1 * | 5/2001 | Cooper et al. ............. 365/212 |
| 6,262,625 | B1 * | 7/2001 | Perner et al. ................. 330/2 |
| 6,297,708 | B1 | 10/2001 | Lemay |
| 6,326,855 | B1 | 12/2001 | Jelinek et al. |
| 6,373,341 | B1 | 4/2002 | Morgan |
| 6,586,989 | B2 * | 7/2003 | Perner et al. ................. 330/9 |
| 6,700,814 | B1 * | 3/2004 | Nahas et al. ............... 365/158 |
| 6,791,874 | B2 * | 9/2004 | Tran et al. ................. 365/158 |
| 6,868,025 | B2 * | 3/2005 | Hsu ........................... 365/211 |

* cited by examiner

*Primary Examiner*—Son Mai

(57) ABSTRACT

A magnetic memory having a calibration system is disclosed. One embodiment of the magnetic memory includes a sense amplifier and a calibration system configured to monitor at least one operating parameter of the magnetic memory and calibrate the sense amplifier if a measured parameter corresponding to the at least one operating parameter is within a range.

32 Claims, 6 Drawing Sheets

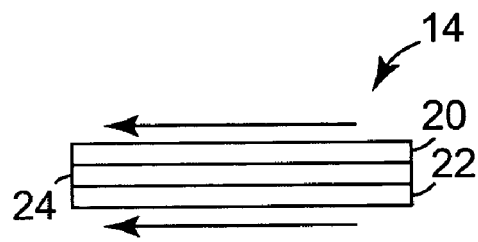 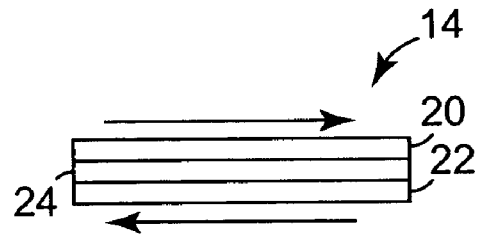
Fig. 2A    Fig. 2B
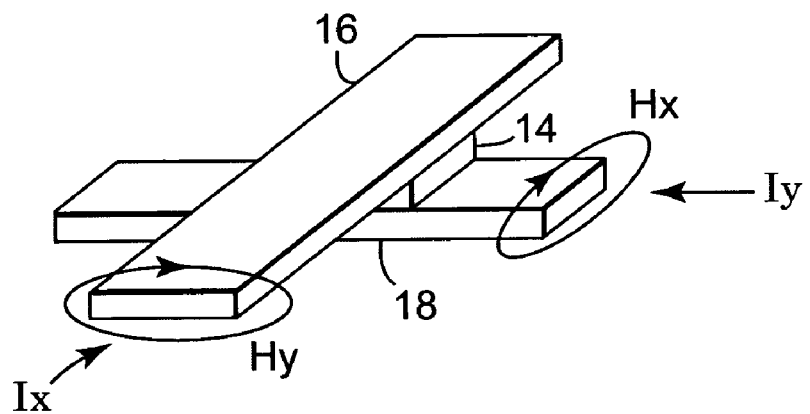
Fig. 3

MAGNETIC MEMORY HAVING A CALIBRATION SYSTEM

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations are referred to as "parallel" and "anti-parallel" orientations. With parallel orientation, the orientation of magnetization in the data storage layer is substantially parallel to the magnetization in the reference layer along the easy axis and the magnetic memory cell is in a low resistance state which can be represented by the value R. With anti-parallel orientation, the orientation of magnetization in the data storage layer is substantially anti-parallel to the magnetization in the reference layer along the easy axis and the magnetic memory cell is in a high resistance state which can be represented by the value R+$\Delta$R. A sense amplifier can be used to sense the resistance state of a selected magnetic memory cell to determine the logic state stored in the memory cell.

The ability of the sense amplifiers to quickly and accurately sense the values of R and R+$\Delta$R depends on the physical design of the sense amplifier and can be affected by such factors as transistor thresholds, process variations, the mismatching of device sizes, and operating conditions which include power supply voltage and ambient temperature. Variations in these factors can result in offset error in the sense amplifiers which can reduce their speed and accuracy. If these variations are significant, data stored in the magnetic memory can become unreliable.

Calibration of the sense amplifiers is typically performed only once when the magnetic memory is first powered up. With this approach, once the sense amplifiers are calibrated, no further calibration is performed. Because the power supply voltage or ambient temperature of the magnetic memory can change after the magnetic memory is powered up, this approach can result in decreased reliability and performance.

SUMMARY OF THE INVENTION

The present invention provides a magnetic memory having a calibration system. One embodiment of the present invention provides a magnetic memory which includes a sense amplifier and a calibration system configured to monitor at least one operating parameter of the magnetic memory and calibrate the sense amplifier if a measured parameter corresponding to the at least one operating parameter is within a range.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIGS. 2A and 2B are diagrams illustrating parallel and anti-parallel magnetization of a magnetic memory cell.

FIG. 3 is a diagram illustrating a magnetic memory cell that has been selected.

DETAILED DESCRIPTION

Figure 1:
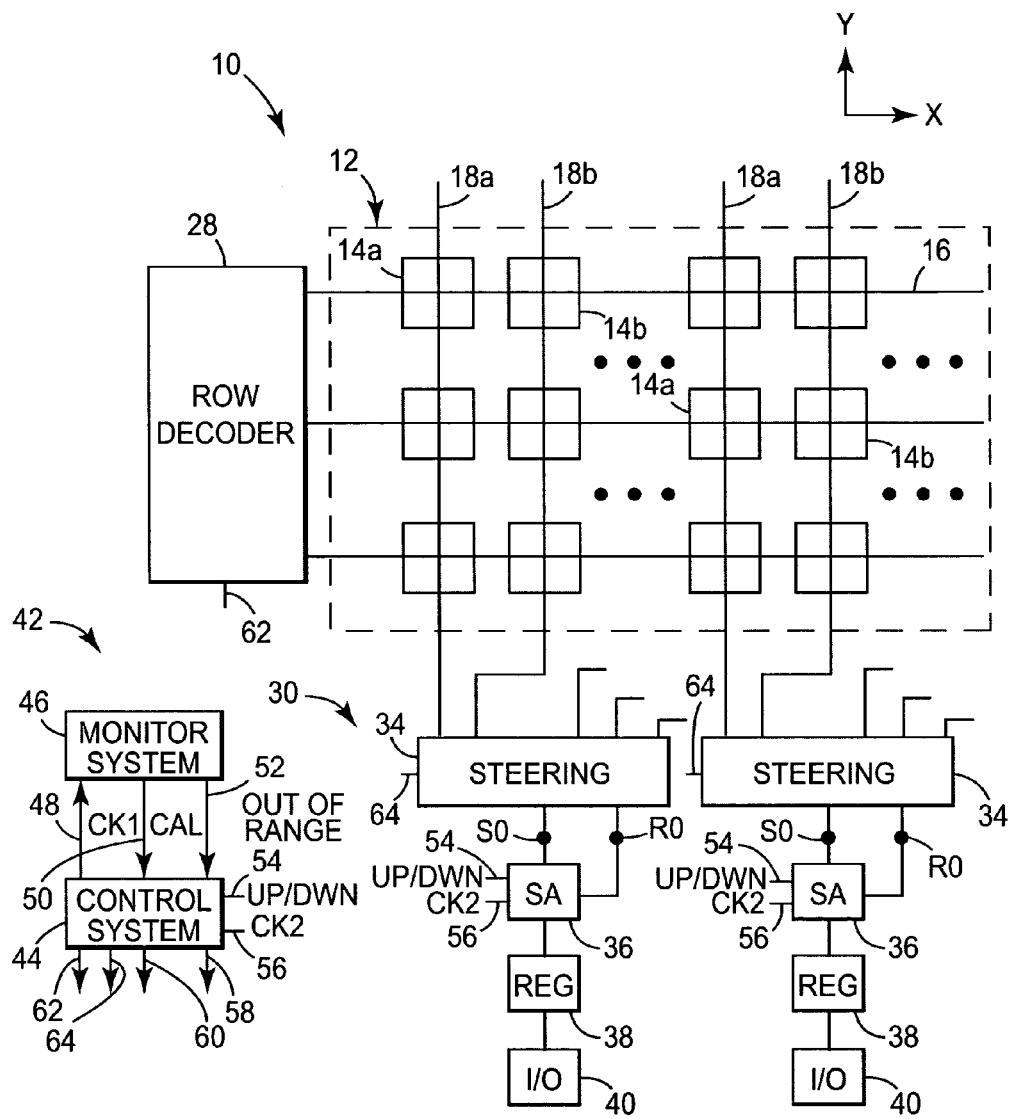
FIG. 1 is a diagram illustrating an exemplary embodiment of a magnetic memory according to the present invention.

FIG. 1 is a diagram illustrating an exemplary embodiment of a magnetic memory 10 according to the present invention. Magnetic memory 10 includes a memory cell array 12 of memory cells 14. The memory cells 14 are arranged in rows and columns, with the rows extending along an x-direction and the columns extending along a y-direction. Only a relatively small number of memory cells 14 are shown to simplify the illustration of magnetic memory 10. In other embodiments, the memory cell arrays can be other suitable sizes.

The memory cells 14 are not limited to any particular type of device. In various embodiments, memory cells 14 include elements that store or generate information by affecting the magnitude of the nominal resistance of the elements. In one embodiment, the memory cells 14 are magnetic memory cells 14 and are spin dependent tunneling ("SDT") junction devices. In alternative embodiments, other types of magnetic memory cells 14 are formed which include, but are not limited to, anisotropic magnetoresistance devices, giant magnetoresistance devices, colossal magnetoresistance devices, extraordinary magnetoresistance devices or very large magnetoresistance devices.

In the exemplary embodiment, word lines 16 extend along the x-direction in a plane across memory cell array 12. Bit lines 18a and 18b extend along the y-direction in a plane across memory cell array 12. In the exemplary embodiment, there is one word line 16 for each row of the array 12, and one bit line 18a or 18b for each column of the array 12. Each memory cell 14a and 14b is located at an intersection or cross point of a word line 16 and a bit line 18a and 18b. In other embodiments, there are other suitable numbers of word lines 16 or bit lines 18.

In the exemplary embodiment, data is stored in memory cells 14*a* and 14*b* in a bit-bit bar manner. In one embodiment, only one memory cell 14 is used to store the data. In other embodiments, more than two memory cells 14 are used to store the data.

In the exemplary embodiment, two memory cells 14*a* and 14*b* are assigned to each bit of data. The memory cell 14*a* (the data memory cell), stores the value of the bit. The memory cell 14*b* (the reference memory cell) stores the complement of the value of the bit. In one embodiment, memory cell 14*a* stores a logic "1" and the corresponding memory cell 14*b* stores a logic "0". In one embodiment, memory cell 14*a* stores a logic "0" and the corresponding memory cell 14*b* stores a logic "1". In the exemplary embodiment, each column of memory cells 14*a* is coupled to a bit line 18*a*, and each column of memory cells 14*b* is coupled to a bit line 18*b*. In another embodiment, one memory cell 14 is assigned to each bit of data.

In the exemplary embodiment, magnetic memory 10 includes a row decoder 28 for selecting word lines 16 during read and write operations. In one embodiment, the selected word line 16 is connected to ground during a read operation. In one embodiment, a write current is applied to a selected word line 16 during a write operation.

In the exemplary embodiment, magnetic memory 10 includes a read circuit illustrated at 30 for sensing the logic states of selected memory cells 14*a* and 14*b* during read operations. The magnetic memory 10 also includes a write circuit for supplying write currents to selected word line 16 and bit lines 18*a* and 18*b* during write operations. The write circuit is not shown in order to simplify the illustration of magnetic memory 10.

In the exemplary embodiment, read circuit 30 includes one or more steering circuits 34 and sense amplifiers 36. Multiple bit lines 18*a* and 18*b* are connected to each steering circuit 34. In various embodiments, any suitable number of bit lines 18 can be connected to each steering circuit 34. In the exemplary embodiment, each steering circuit 34 includes a decoder for selecting bit lines. Selected memory cells 14*a* and 14*b* lie at the intersection of a selected word line 16 and selected bit lines 18*a* and 18*b*.

In the exemplary embodiment, during a read operation, selected memory cells 14*a* and 14*b* are connected to ground by the selected word line 16. Each steering circuit 34 selects a bit line 18*a* crossing a column of memory cells 14*a* and selects a bit line 18*b* crossing a corresponding column of memory cells 14*b*. The selected bit lines 18*a* crossing the columns of memory cells 14*a* are coupled to sense nodes S0 of corresponding sense amplifiers 36. The selected bit lines 18*b* crossing the columns of memory cells 14*b* are coupled to reference nodes R0 of corresponding sense amplifiers 36. In one embodiment, each sense amplifier 36 compares the data read from selected memory cells 14*a* and 14*b* and provides an output which is a logic "0" if memory cell 14*a* is storing a logic "0" and the corresponding memory cell 14*b* is storing a logic "1", and provides an output which is a logic "1" if memory cell 14*a* is storing a logic "1" and the corresponding memory cell 14*b* is storing a logic "0". In one embodiment, each sense amplifier 36 compares the data read from selected memory cells 14*a* and 14*b* and provides an output which is a logic "0" if memory cell 14*a* is storing a logic "1" and the corresponding memory cell 14*b* is storing a logic "0", and provides an output which is a logic "1" if memory cell 14*a* is storing a logic "0" and the corresponding memory cell 14*b* is storing a logic "1".

In the exemplary embodiment, unselected word lines 16 and bit lines 18*a* and 18*b* are coupled to a constant voltage source, wherein the constant voltage source provides an array voltage. In one embodiment, the constant voltage source is provided by an external circuit. In the exemplary embodiment, the sense amplifiers 36 apply the same potential to selected bit lines 18 as the constant voltage source applies to the unselected word lines 16 and bit lines 18*a* and 18*b*. This approach of applying equipotential isolation to the array 12 reduces parasitic currents.

In the exemplary embodiment, the read circuit 30 reads out data in m-bit words, wherein the logic states of a number (m) of memory cell elements 14*a* and 14*b* are sensed simultaneously, wherein m is any suitable number which is at least one. An m-bit word is read out by operating m consecutive sense amplifiers 36. In other embodiments, each sense amplifier 36 can read out data from any suitable number of selected bit lines 18.

In the exemplary embodiment, a calibration system 42 is configured to monitor at least one operating parameter of magnetic memory 10 and calibrate one or more sense amplifiers 36 if a measured parameter corresponding to the at least one operating parameter is within a range. In various embodiments, the operating parameters can be any environmental condition including, but not limited to, ambient temperature or power supply voltage.

In various embodiments, the measured parameter can be any parameter which can be monitored and measured, either within or external to magnetic memory 10, and which corresponds or correlates with the performance of magnetic memory 10. In one embodiment, the measured parameter is an oscillation period for a ring oscillator 170 (see also, FIG. 5). In one embodiment, the measured parameter is a voltage output of a diode circuit 270 (see also, FIG. 6).

Figure 4:
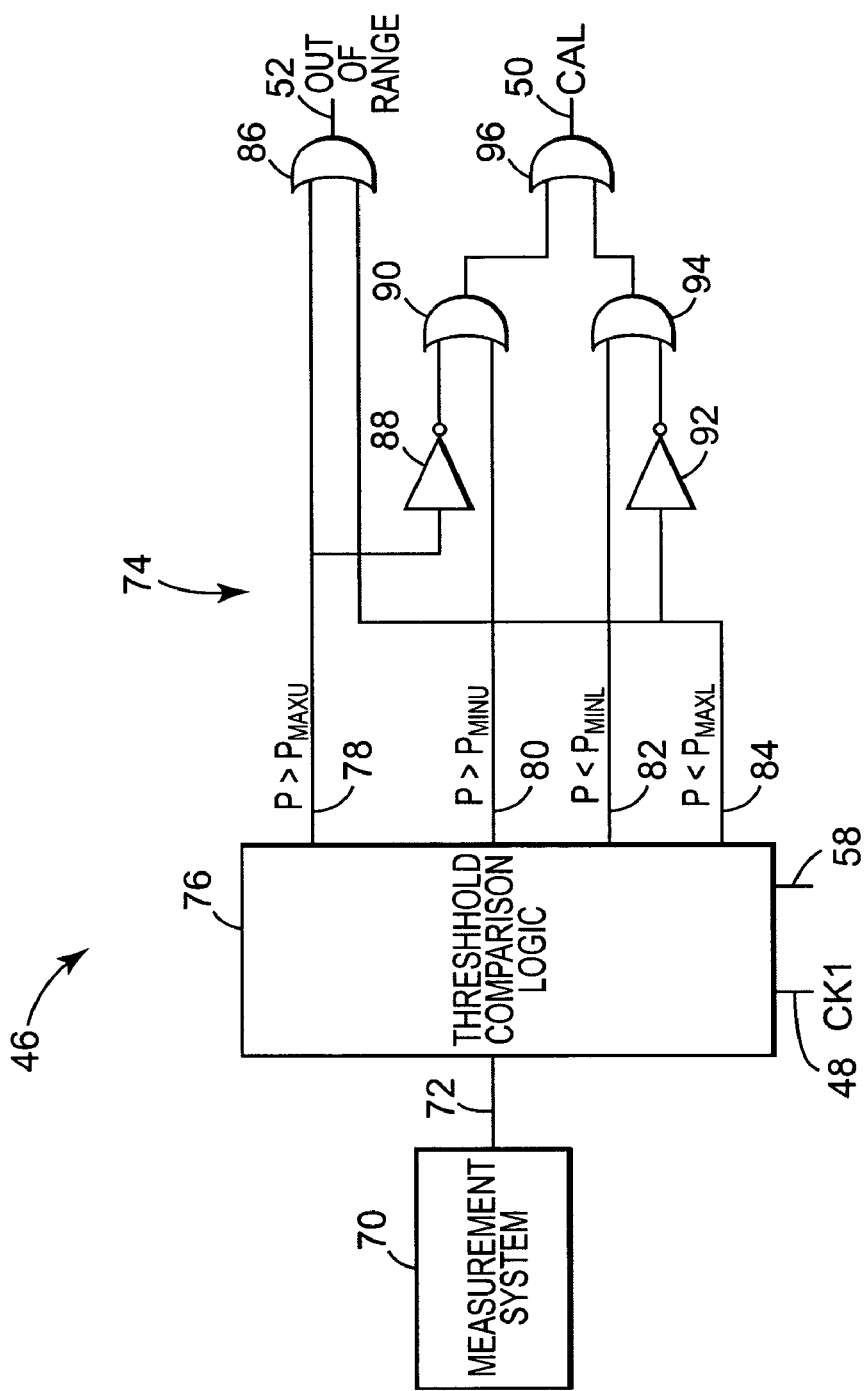
FIG. 4 is a diagram illustrating an exemplary embodiment of a monitor system.

In the exemplary embodiment, calibration system 42 includes a monitor system 46 (see also, FIG. 4). The monitor system 46 is configured to monitor the operating parameters of magnetic memory 10 and provide a first indication or a calibration flag at line 50 if the measured parameter is within a range, and to provide a second indication or an out of range flag at line 52 if the measured parameter is not within the range. In various embodiments, the monitor system can be located within magnetic memory 10 or located external to magnetic memory 10. In one embodiment, monitor system 46 is fabricated on the same substrate as magnetic memory 10. In one embodiment, monitor system 46 is located external to magnetic memory 10 and is electrically coupled to magnetic memory 10.

In the exemplary embodiment, calibration system 42 includes a control system 44. Control system 44 provides a first clock (CK1) at 48 to monitor system 46 to control monitor system 46. In various embodiments, other control lines can be utilized to control monitor system 46. Control system 44 receives the first indication or calibration flag at line 50 and the second indication or out of range flag at line 52 from monitor system 46. In the exemplary embodiment, when monitor system 46 is providing the first indication or calibration flag at line 50, control system 44 initiates a calibration of at least one sense amplifier 36. In various embodiments, control system 44 can initiate a calibration of any suitable number of sense amplifiers 36. In the exemplary embodiment, control system 44 provides up/down control via line 54 to one or more offset calibration systems 120 to set a counting mode used during the calibration (see also, FIGS. 7–10). Control system 44 provides a second clock (CK2) at 56 to one or more offset calibration systems 120 to control the offset calibration systems 120 (see also, FIGS. 8–10). Control system 44 provides threshold values via line 58 which are compared against the measured parameter to determine if the measured parameter is within or outside of the range. In various embodiments, other control lines can be used to control the offset calibration systems 120.

In the exemplary embodiment, when monitor system 46 is providing the second indication or out of range flag at line 52, control system 44 provides a data invalid flag at line 60. In the exemplary embodiment, the data invalid flag at line 60 indicates that data stored in magnetic memory 10 may be invalid because one or more of the operating parameters of magnetic memory 10 have been exceeded. In various embodiments, the data invalid flag can be sent to a host computer system and the host computer system determines whether or not the sense amplifiers 36 should be calibrated. In other embodiments, other indications or flags can be provided by control system 44.

In various embodiments, information which includes the first indication or calibration flag, the second indication or out of range flag, or the data invalid flag, is stored in memory cells 14. In one embodiment, a dedicated address space within memory cell array 12 is used to store the information. In other embodiments, any suitable location within memory cell array 12 is used to store the information. In the exemplary embodiment, at least two memory cells 14 are used to store the information. In one embodiment, one memory cell 14 is used to store the information. In one embodiment, the information is stored in memory cells or storage registers located within control system 44. In other embodiments, the information is stored in other suitable locations within magnetic memory 10, or is stored in one or more locations which are external to magnetic memory 10. In various embodiments, the information stored within magnetic memory is read out of magnetic memory 10 to indicate that a calibration of sense amplifiers 36 must be initiated or that the data stored within magnetic memory 10 may be unreliable. In other embodiments, only one of either the calibration flag or the data invalid flag is stored in one or more memory cells 14.

FIGS. 2A and 2B are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a "free" layer because it has a magnetization orientation that is not pinned and which can be oriented in either of two directions along the easy axis which lies in a plane. Reference layer 22 is referred to as a "pinned" layer because it has a magnetization that is oriented in a plane but is fixed so as not to rotate in the presence of an applied magnetic field within a range of interest. FIG. 2A illustrates by arrows a "parallel" orientation when the magnetization of the free and pinned layers 20 and 22 are in the same direction. FIG. 2B illustrates by arrows an "anti-parallel" orientation when the magnetization of the free and pinned layers 20 and 22 are in opposite directions.

The insulating tunnel barrier 24 allows quantum mechanical tunneling to occur between the free and pinned layers. This tunneling phenomenon is electron spin dependent, making the resistance of the spin dependent tunneling device a function of the relative orientations of the magnetization of the free and pinned layers 20 and 22. The resistance of magnetic memory cells 14 is a first value R if the orientation of magnetization of the free and pinned layers 20 and 22 is parallel as illustrated in FIG. 2A. The resistance of magnetic memory cell 14 is increased to a second value R+ΔR when the orientation of magnetization is changed from parallel to anti-parallel as illustrated in FIG. 2B.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

FIG. 3 is a diagram illustrating a magnetic memory cell that has been selected. In one embodiment, the magnetization in free layer 20 of selected magnetic memory cell 14 is oriented by supplying the currents Ix and Iy to conductors 16 and 18 which cross selected magnetic memory cell 14. Supplying the current Ix to word line 16 causes a magnetic field Hy to form around conductor 16. Supplying the current Iy to bit line 18 causes a magnetic field Hx to form around bit line 18. When sufficiently large currents Ix and Iy are passed through word line 16 and bit line 18, the magnetic fields Hx and Hy in the vicinity of free layer 20 causes the magnetization of free layer 20 to rotate from the parallel orientation to the anti-parallel orientation, or to rotate from the anti-parallel orientation to the parallel orientation.

In one embodiment, a magnetic memory cell 14 is read by applying sense currents to word line 16 and bit line 18. Magnetic memory cell 14 will have either a resistance of R or a resistance of R+ΔR, depending on whether the orientation of magnetization of the free and pinned layers 20 and 22 is parallel or anti-parallel as illustrated in FIGS. 2A and 2B.

FIG. 4 is a diagram illustrating an exemplary embodiment of a monitor system 46. In the exemplary embodiment, monitor system 46 includes a measurement system 70 and a reference comparator 74. In the exemplary embodiment, measurement system 70 is configured to measure the measured parameter and to provide an output 72 which corresponds with or is proportional to the measured value of the measured parameter. In one embodiment, output 72 is a voltage output wherein the voltage level corresponds to the measured value of the measured parameter. In one embodiment, output 72 is a current output wherein the current level corresponds to the measured value of the measured parameter. In other embodiments, output 72 conducts a binary signal, which, either serially or in parallel, provides a binary count which corresponds to the measured value of the measured parameter. In other embodiments, output 72 can use any suitable means to communicate the measured value of the measured parameter to threshold comparison logic 76.

Figure 5:
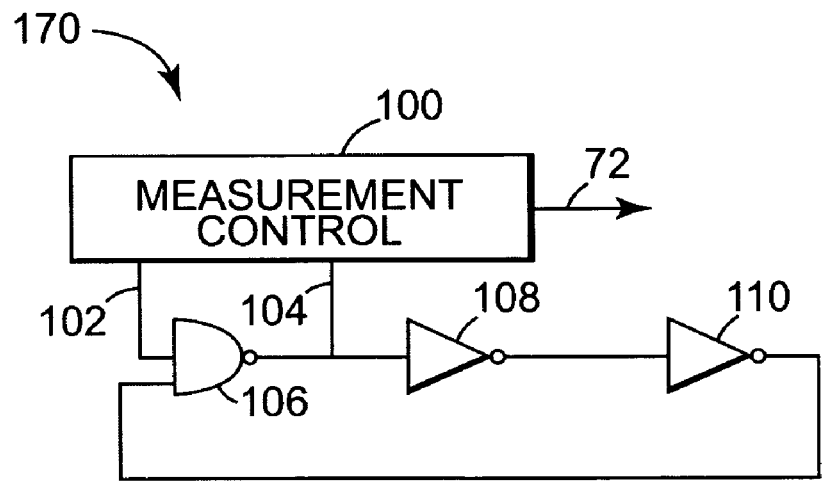
FIG. 5 is a diagram illustrating an exemplary embodiment of a ring oscillator circuit.

In one embodiment, measurement system 70 includes a ring oscillator circuit 170 (see also, FIG. 5). In one embodiment, the measured parameter is an oscillation period for the ring oscillator circuit 170. In one embodiment, measurement system 70 includes a diode circuit 270 (see also, FIG. 6). In one embodiment, the measured parameter is a voltage output of the diode circuit 270. In one embodiment, measurement system 70 includes a sensor which is configured to measure the measured parameter. In other embodiments, measurement system 70 can be any suitable circuit or device, either located on the same substrate as magnetic memory 10 or located external to magnetic memory 10, which can measure the measured parameter and provide an output 72 which corresponds to the measured parameter.

In the exemplary embodiment, reference comparator 74 is configured to compare the measured value of a measured parameter (P) provided at output 72 to a maximum upper value ($P_{MAXU}$) and a maximum lower value ($P_{MAXL}$) which defines the range. Reference comparator 74 provides the first indication or calibration flag if P is equal to or greater than $P_{MAXL}$ and equal to or less than $P_{MAXU}$. Reference comparator 74 provides the second indication or out of range flag if P is greater than $P_{MAXU}$ or less than $P_{MAXL}$.

In the exemplary embodiment, $P_{MAXU}$ and $P_{MAXL}$ define upper and lower values of the range in which the one or more sense amplifiers 36 can be calibrated. If P is greater than $P_{MAXU}$ or is less than $P_{MAXL}$, the value of P indicates that one or more of the operating parameters has exceeded the acceptable operating range and the sense amplifiers 36 cannot be calibrated. When this occurs, the second indication or out of range indication is provided at line 52. In the exemplary embodiment, when P is equal to or greater than $P_{MAXL}$ and equal to or less than $P_{MAXU}$, P is within a range which indicates that the sense amplifiers 36 can be calibrated.

In the exemplary embodiment, the values of $P_{MAXL}$ and $P_{MAXU}$ are provided by control system 44 via line 58. In one embodiment, $P_{MAXL}$ and $P_{MAXU}$ are provided to magnetic memory 10 from an external source. In other embodiments, $P_{MAXL}$ and $P_{MAXU}$ are values which are either stored within magnetic memory 10 or coded into logic on magnetic memory 10.

In the exemplary embodiment, the range further includes a minimum upper value ($P_{MINU}$), which is less than $P_{MAXU}$, and a minimum lower value ($P_{MINL}$), which is greater than $P_{MAXL}$. In the exemplary embodiment, $P_{MINU}$ is greater than $P_{MINL}$. In the exemplary embodiment, $P_{MINU}$ and $P_{MINL}$ define a range for P wherein a calibration of sense amplifiers 36 is not required.

In the exemplary embodiment, reference comparator 74 is configured to provide the first indication or calibration flag at line 50 if P is greater than $P_{MINU}$ and equal to or less than $P_{MAXU}$, or if P is less than $P_{MINL}$ and equal to or greater than $P_{MAXL}$. If P is between $P_{MINU}$ and $P_{MINL}$, P has not changed sufficiently and the sense amplifiers 36 are not calibrated. If P is greater than $P_{MAXU}$ or is less than $P_{MAXL}$, the value of P indicates that at least one operating parameter has exceeded the acceptable operating range such that the sense amplifiers 36 cannot be calibrated. Reference comparator 74 provides the second indication or out of range flag at line 50 if P is greater than $P_{MAXU}$ or less than $P_{MAXL}$.

In the exemplary embodiment, the values of $P_{MINL}$ and $P_{MINU}$ are provided by control system 44 via line 58. In one embodiment, $P_{MINL}$ and $P_{MINU}$ are provided to magnetic memory 10 from an external source. In other embodiments, $P_{MINL}$ and $P_{MINU}$ are stored values which are dynamically set within magnetic memory 10 each time magnetic memory 10 is calibrated.

In the exemplary embodiment, threshold comparison logic 76 compares the value of P to $P_{MAXU}$, $P_{MINU}$, $P_{MINL}$ and $P_{MAXL}$. If the value of P is greater than $P_{MAXU}$, a logic output is provided on line 78. If the value of P is greater than $P_{MINU}$, a logic output is provided on line 80. If the value of P is less than $P_{MINL}$, a logic output is provided on line 82. If the value of P is less than $P_{MAXL}$, a logic output is provided on line 84. OR gate 86 provides the out of range output at line 52 if P is greater than $P_{MAXU}$ or if P is less than $P_{MAXL}$. OR gate 96 has inputs coupled to OR gate 90 and OR gate 94. OR gate 90 has the output of inverter 88 and line 80 as inputs and provides a logic output if P is equal to or less than $P_{MAXU}$ or if P is greater than $P_{MINU}$. OR gate 94 has the output of inverter 92 and line 82 as inputs and provides a logic output if P is equal to or greater than $P_{MAXL}$ or if P is less than $P_{MINL}$. OR gate 96 provides the first indication or calibration flag at line 50 if P is greater than $P_{MINU}$ and equal to or less than $P_{MAXU}$, or if P is less than $P_{MINL}$ and equal to or greater than $P_{MAXL}$.

FIG. 5 is a diagram illustrating an exemplary embodiment of a ring oscillator circuit 170. In the exemplary embodiment, the process used to fabricate magnetic memory 10 is a complementary metal oxide semiconductor (CMOS) process. In this embodiment, the oscillation period corresponds to or is proportional to the ambient temperature of magnetic memory 10 and is inversely proportional to the supply voltage applied to magnetic memory 10.

In the exemplary embodiment, ring oscillator circuit 170 includes a measurement control circuit 100 and includes a NAND gate 106 and inverters 108 and 110. Measurement control circuit 100 initiates a signal at line 102 and measures the measured parameter at line 104 which is an oscillation period for the ring oscillator. The oscillation period is provided at output 72. In various embodiments, any suitable even number of inverters can be included.

In the exemplary embodiment, the oscillation period of ring oscillator circuit 170 will change when one or more of the operating parameters change. In one embodiment, magnetic memory 10 is fabricated on a CMOS substrate. The switching speed of CMOS transistors increases with lower temperatures and/or higher voltages and decreases with higher temperatures and/or lower voltages. When the operating parameters include the power supply voltage supplied to the magnetic memory 10 or the ambient temperature of magnetic memory 10, a change in either or both of these operating parameters can be detected by a change in the oscillation period of ring oscillation circuit 170. In other embodiments, any suitable configuration of ring oscillation circuit 170 can be used.

Figure 6:
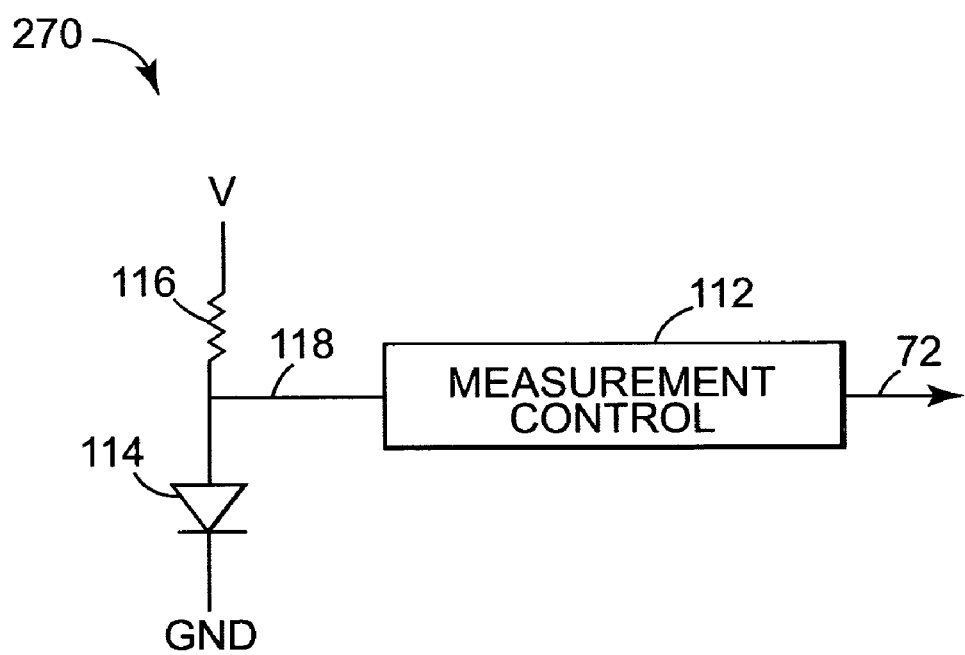
FIG. 6 is a diagram illustrating an exemplary embodiment of a diode circuit.

FIG. 6 is a diagram illustrating an exemplary embodiment of a diode circuit 270. In the exemplary embodiment, magnetic memory 10 is fabricated on a CMOS process. In this embodiment, the voltage output of the diode circuit 270 is proportional to the ambient temperature of magnetic memory 10.

In the exemplary embodiment, diode circuit 270 includes a diode 114 and a resistor 116. A measurement control circuit 112 is coupled at line 118 to diode 114 and resistor 116 and measures the measured parameter which is a voltage across diode 114. In the exemplary embodiment, diode 114 is forward biased and the voltage drop across the junction of diode 114 changes at a rate of approximately 2.24 mV/degree Celsius. In one embodiment, the diode 114 is a silicon diode. In the exemplary embodiment, the value of the voltage across diode 114 is provided at output 72 so changes in the voltage across diode 114 can be detected at output 72. In other embodiments, any suitable configuration of diode circuit 270 can be used.

Figure 7:
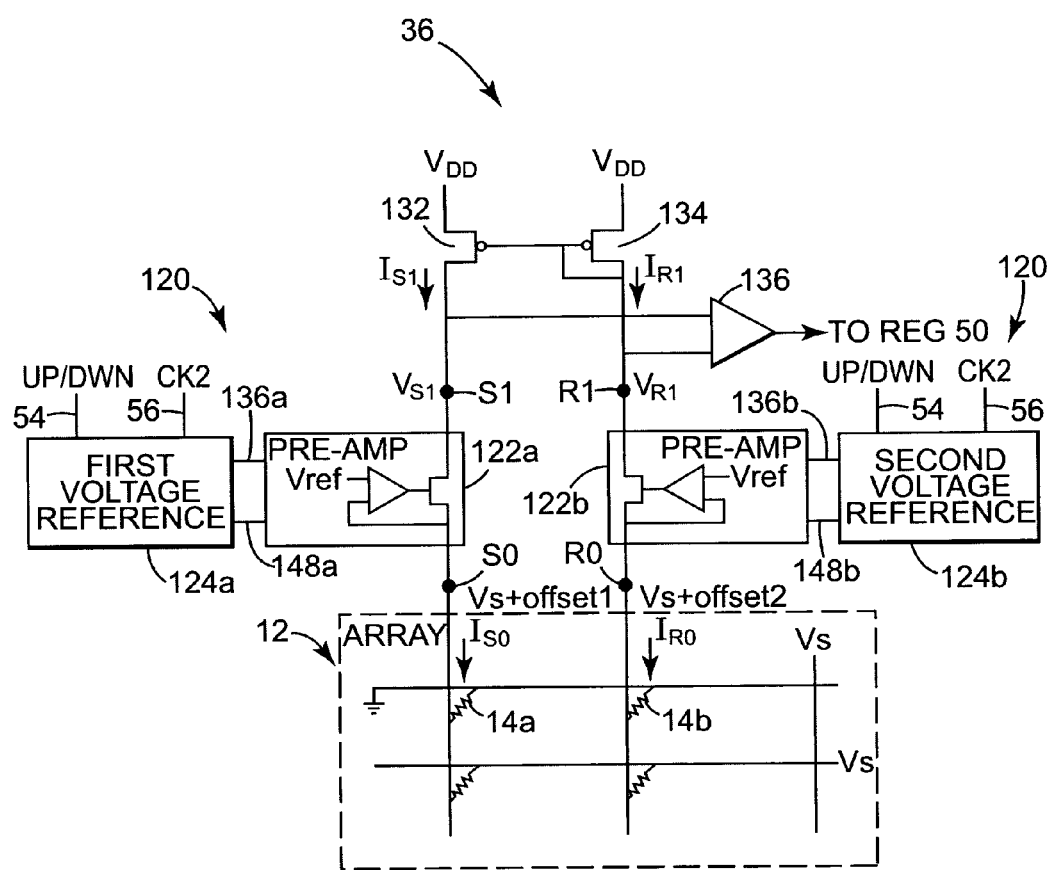
FIG. 7 is a diagram illustrating an exemplary embodiment of an offset calibration system coupled to a sense amplifier.

FIG. 7 is a diagram illustrating an exemplary embodiment of an offset calibration system 120 coupled to a sense amplifier 36. Offset calibration system 120 is configured to calibrate one or more sense amplifiers 36 when monitor system 46 is providing the first indication or calibration flag. In various embodiments, offset calibration system 120 can be any suitable device or circuit, located either external to magnetic memory 10 or located within magnetic memory 10, which can calibrate one or more sense amplifiers 36 when monitor system 46 is providing the first indication or calibration flag. In the exemplary embodiment, each sense amplifier 36 includes an offset calibration system 120. In one embodiment, one offset calibration system 120 is coupled to all sense amplifiers 36. In other embodiments, any suitable number of offset calibration systems 120 can be used.

In the exemplary embodiment, offset calibration system 120 includes a first voltage reference circuit 124a and a second voltage reference circuit 124b. First voltage reference circuit 124a is responsive to control signals up/down at 54 and CK2 at 56 and is configured to provide a first first back gate bias voltage Vcc+ at 136a and a first second back gate bias voltage Vcc− at 148a to the first direct injection preamplifier 122a of sense amplifier 36. Second voltage reference circuit 124b is responsive to control signals up/down at 54 and CK2 at 56 and is configured to provide a second first back gate bias voltage Vcc+ at 136b and a second second back gate bias to voltage Vcc− at 148b to the second direct injection preamplifier 122b of sense amplifier 36.

One approach to controlling back gate bias voltages in a preamplifier is disclosed in U.S. Pat. No. 6,262,625 to Perner et al., issued Jul. 17, 2001, entitled "Operational Amplifier with Digital Offset Calibration," which is incorporated herein by reference. In other embodiments, other suitable approaches can be used to control the back gate bias voltages in preamplifiers 122a and 122b.

In the exemplary embodiment, sense amplifier 36 includes, respectively, first and second field effect transistors ("FETs") illustrated at 132 and 134. The FETs 132 and 134 together form a mirror current source circuit. In the exemplary embodiment, FET 134 is configured as a p-channel FET and functions as a "reference" or "master" transistor. The FET 132 functions as a "mirror" or "slave" transistor which passes a current which is directly proportional to the current in the reference transistor 134. The current in the mirror transistor 132 is referred to as the mirror current. In the exemplary embodiment, FETs 132 and 134 are CMOS transistors. In other embodiments, the FETs can be formed with other suitable technologies.

In the exemplary embodiment, FETs 132 and 134 amplify a voltage $V_{S1}$, generated at a first input node $S_1$. A voltage $V_{R1}$ at a second input node $R_1$ is set by a reference current $I_{R1}$ flowing through reference FET 134. The FET 134 gate-to-source voltage is proportional to the current $I_{R1}$ flowing through the reference FET 134, and the voltage falls into a narrow range near the threshold voltage of reference FET 134. The same gate-to-source voltage is applied to the mirror FET 132. If the drain voltage $V_{S1}$ at the first input node $S_1$ of mirror FET 132 is equal to the drain voltage $V_{R1}$ at the second input node $R_1$ of the reference transistor 134, the drain current $I_{S1}$ conducted by mirror FET 132 will be the same as the drain current $I_{R1}$ conducted by reference FET 134.

In the exemplary embodiment, the configuration of the mirror FET 132 presents a high impedance at the first input node $S_1$. When the sense current $I_{S1}$ is not equal to the reference current $I_{R1}$ the voltage $V_{S1}$ at the first input node $S_1$ will vary in an attempt to satisfy the mirror conditions required by FET 132 and FET 134. If the sense current $I_{S1}$ is less than the reference current $I_{R1}$, the first input node voltage $V_{S1}$ will rise toward the supply voltage $V_{DD}$. If the sense current $I_{S1}$ is greater than the reference current $I_{R1}$ the first input node voltage $V_{S1}$ will be pulled down to approximately the voltage at node S0. In this manner, the current mirror circuit generates a large voltage difference when the sense current $I_{S1}$ is not equal to the reference current $I_{R1}$.

In the exemplary embodiment, the voltage signal out of nodes $S_1$ and $R_1$ should be large enough to drive comparator 136 to a valid digital level, such as a logic "1" or a "0". In the exemplary embodiment, the differential voltage amplified across input nodes $S_1$ and $R_1$ (the difference between $V_{DD}-V_{S1}$ and $V_{DD}-V_{R1}$) drives comparator 136 to one logic state when $(V_{DD}-V_{S1})>(V_{DD}-V_{R1})$, and to a second logic state when $(V_{DD}-V_{S1})<(V_{DD}-V_{R1})$.

In the exemplary embodiment, the first direct injection preamplifier 122a is coupled between nodes S0 and S1 and the second direct injection preamplifier 122b is coupled between nodes R0 and R1. Direct injection preamplifiers 122a and 122b regulate the voltages across the selected memory cells 14a and 14b. The direct injection preamplifiers 122a and 122b are calibrated by adjusting internal back gate bias voltages according to digital data stored in internal registers (see FIG. 10) controlling the back gate bias circuits (see FIGS. 8 and 9) in the first voltage reference circuit 124a and in the second voltage reference circuit 124b to minimize differences in their offset voltages (offset1, offset2). The offset voltages (offset1, offset2) should be very close to being equal to each other and should be near zero. In the exemplary embodiment, sense amplifier 36 is calibrated by the first voltage reference circuit 124a and preamplifier 122a, and by the second voltage reference circuit 124b and preamplifier 122b.

In the exemplary embodiment, changes in operating parameters such as temperature or supply voltage can cause the sense amplifiers 36 to become unbalanced. When sense amplifiers 36 are unbalanced, the conditions $(V_{DD}-V_{S1})>(V_{DD}-V_{R1})$ and $(V_{DD}-V_{S1})<(V_{DD}-V_{R1})$ will not be sensed equally and the sense amplifier will more easily sense one logic state over another. This can become problematic if the integration time required by the sense amplifier to sense a particular logic state becomes greater than the access time requirement for magnetic memory 10. By adjusting the first and second back gate bias voltages Vcc+ at 136a and Vcc− at 148a, and the first and second back gate bias voltages Vcc+ at 136b and Vcc− at 148b, the unbalanced condition can be corrected.

Sense amplifiers 36 can perform sensing in either current mode or voltage mode. This is disclosed in U.S. Pat. No. 6,256,247 to Perner et al., issued Jul. 3, 2001, entitled "Differential Sense Amplifiers for Resistive Cross Point Memory Cell Arrays," which is incorporated herein by reference.

In the exemplary embodiment, voltage reference circuits 124a and 124b receive from control system 44 the up/down control signal at input 54 and the second clock CK2 at input 56. The second clock CK2 at 56 controls the operation of up/down counter registers 152 (see FIG. 10). In other embodiments, other suitable inputs can be used to control the operation of up/down counter registers 152.

In the exemplary embodiment, first voltage reference 124a is responsive to digital data stored in up/down counter registers 152, input up/down at 54 and input CK2 at 56, which adjust an impedance of a plurality of transistors to adjust the first and second back gate bias voltages provided by first voltage reference 124a at 136a and 148a. An amount of an adjustment of the plurality of transistors is determined by the first data Q0:Q3 (see FIG. 8) and by the second data Q0:Q3 bar (see FIG. 9). The first data Q0:Q3 and the second data Q0:Q3 bar are stored in first voltage reference 124a. Second voltage reference 124b is responsive to digital data stored in up/down counter registers 152, input up/down at 54 and input CK2 at 56, which adjust an impedance of a plurality of transistors to adjust the first and second back gate bias voltages provided by second voltage reference 124b at 136b and 148b. An amount of an adjustment of the plurality of transistors is determined by the first data Q0:Q3 (see FIG. 8) and by the second data Q0:Q3 bar (see FIG. 9). The first data Q0:Q3 and the second data Q0:Q3 bar are stored in second voltage reference 124b.

Figure 8:
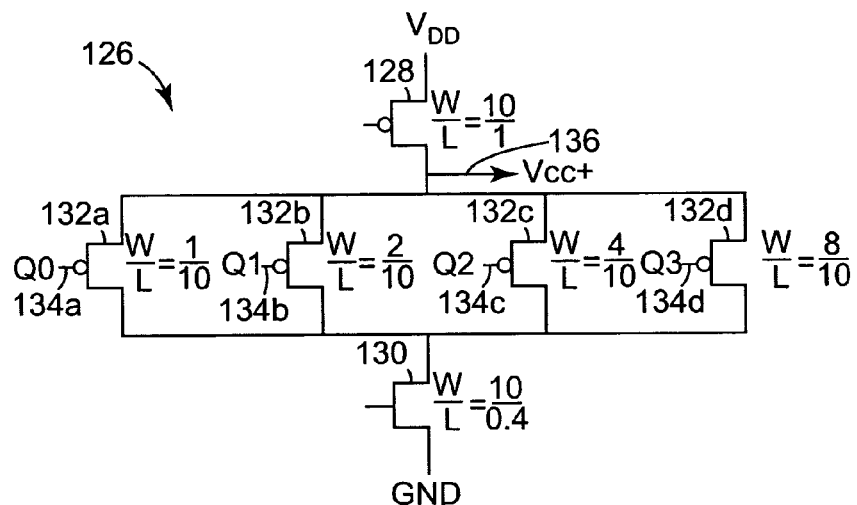
FIG. 8 is a schematic diagram illustrating an exemplary embodiment of a first voltage divider circuit.

FIG. 8 is a schematic diagram illustrating an exemplary embodiment of a first voltage divider circuit 126. In the exemplary embodiment, each voltage reference 124 includes a first voltage divider circuit 126, a second voltage divider circuit 138, and an up/down counter circuit 150.

First voltage reference 124a supplies first correction voltages to preamplifier 122a which includes the first first and first second back gate bias voltages at 136a and 148a. First voltage reference 124a includes a first first voltage divider circuit 126a, a first second voltage divider circuit 138a and a first up/down counter circuit 150a.

Second voltage reference 124b supplies second correction voltages to preamplifier 122b which includes the second first and second second back gate bias voltages at 136b and 148b. Second voltage reference 124b includes a second first voltage divider circuit 126b, a second second voltage divider circuit 138b and a second up/down counter circuit 150b.

The first voltage divider circuit 126 is a programmable voltage divider circuit which controls a first back gate bias voltage for a first FET transistor in a differential pair amplifier (not illustrated) in preamplifier 122. The first back gate bias voltage Vcc+ is set according to the first data Q0:Q3 which is stored in up/down counter 150. First voltage divider circuit 126 is connected between a power supply source $V_{DD}$ and a ground connection GND First voltage divider circuit 126 includes a FET 128 and a FET 130. First voltage divider circuit 126 also includes FETs 132a–132d which have different drain to source resistances.

In the illustration of FIG. 8, the term "W/L" refers to the ratio of the gate width of the FET divided by the gate length of the FET. In the exemplary embodiment, the W/L ratio illustrated for the FETs 132a–132d are 1/10, 2/10, 4/10, and 8/10 and illustrate the FET size variations which set the voltage divider ratios. In other embodiments, other W/L ratios can be used. In other embodiments, other suitable numbers of FETs can be used, depending on the range and resolution of the reference voltage desired.

In the exemplary embodiment, FET 132a has a gate coupled to Q0 at 134a, FET 132b has a gate coupled to Q1 at 134b, FET 132c has a gate coupled to Q2 at 134c and FET 132d has a gate coupled to Q3 at 134d. Turning different combinations of FETs 132 on into a conductive state when FETs 128 and 130 are turned on into a conductive state will vary the back gate bias voltage Vcc+ at 136.

Figure 9:
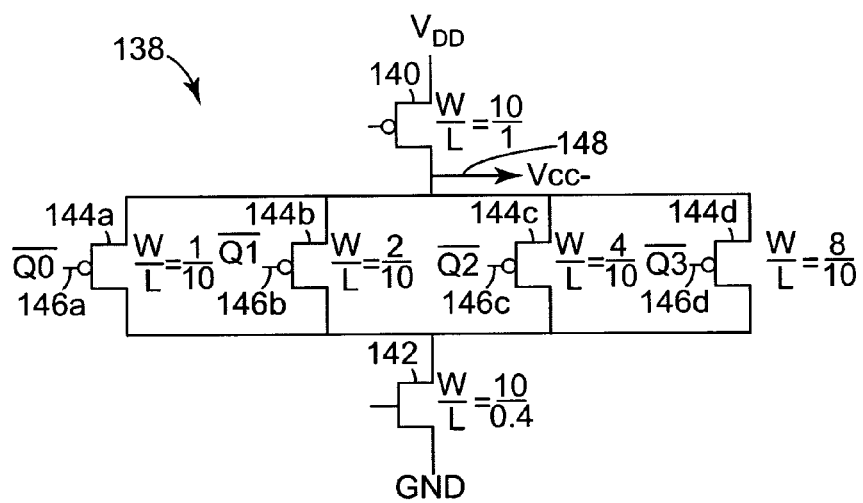
FIG. 9 is a schematic diagram illustrating an exemplary embodiment of a second voltage divider circuit.

FIG. 9 is a schematic diagram illustrating an exemplary embodiment of a second voltage divider circuit 138. In the exemplary embodiment, second voltage divider circuit 138 is a programmable voltage divider circuit which controls a second back gate bias voltage for a second FET transistor in a differential pair amplifier (not illustrated) in preamplifier 122. The second back gate bias Vcc− voltage is set according to the second data Q0:Q3 bar which is stored in up/down counter 150. Second voltage divider circuit 138 is connected between a power supply source $V_{DD}$ and a ground connection GND. Second voltage reference circuit 138 includes a FET 140 and a FET 142. Second voltage reference circuit 138 also includes FETs 144a–144d which have different drain to source resistances.

In the exemplary embodiment, the W/L ratio illustrated for the FETs 144a–144d are 1/10, 2/10, 4/10, and 8/10 and illustrate the FET size variations which set the voltage divider ratios. In other embodiments, other W/L ratios can be used. In other embodiments, other suitable numbers of FETs can be used, depending on the range and resolution of the reference voltage desired.

In the exemplary embodiment, FET 144a has a gate coupled to Q0 bar at 146a, FET 144b has a gate coupled to Q1 bar at 146b, FET 144c has a gate coupled to Q2 bar at 146c, and FET 144d has a gate coupled to Q3 bar at 146d. Turning different combinations of FETs 144 on into a conductive state when FETs 140 and 142 are turned on into a conductive state will vary the back gate bias voltage Vcc− at 148.

In the exemplary embodiment, the first data Q0:Q3 is a complement of the second data Q0:Q3 bar. Thus, Q0 has a logic state which is the inverse of the logic state of Q0 bar, Q1 has a logic state which is the inverse of the logic state of Q1 bar, Q2 has a logic state which is the inverse of the logic state of Q2 bar and Q3 has a logic state which is the inverse of the logic state of Q3 bar.

Figure 10:
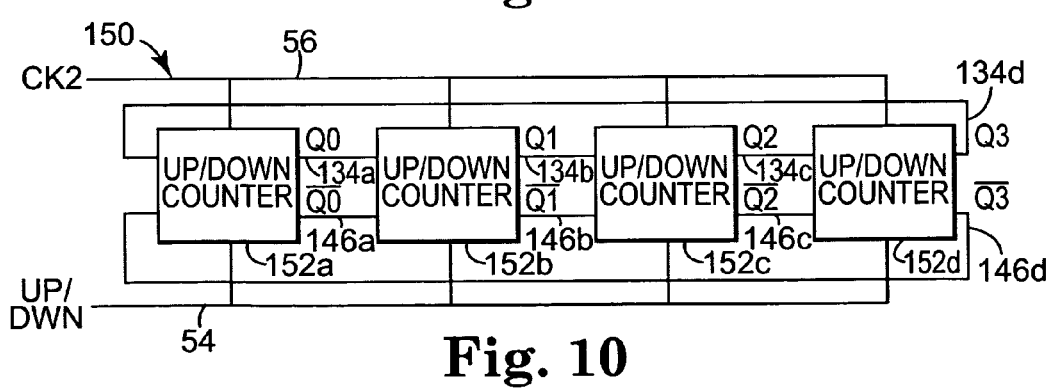
FIG. 10 is a schematic diagram illustrating an exemplary embodiment of an up/down counter.

FIG. 10 is a schematic diagram illustrating an exemplary embodiment of an up/down counter 150. Up/down counter 150 is configured to store offset data and provide the first data Q0:Q3 and the second data Q0:Q3 bar. In the exemplary embodiment, the first up/down counter 150a within first voltage reference 124a stores first offset data, and the second up/down counter 150b within second voltage reference 124b stores second offset data.

In the exemplary embodiment, up/down counter 150 includes up/down counter/registers 152a–152d which store, respectively, Q0 and Q0 bar through Q3 and Q3 bar. Each counter/register 152 provides a true and complement output at 134 and 146 respectively. The counter/registers 152 store the state of the calibration, and control changes in the state of the calibration.

In the exemplary embodiment, each counter/register 152 has a CK2 clock input at 56 to control the operation of the counter/register 152. The CK2 clock is provided by control system 44. Each counter/register 152 has an up/down control input at 54 to set the counting mode to either count up or count down. The up/down control input at 54 is provided by control system 44. In other embodiments, other suitable control inputs can be used to control the operation of up/down counter 150.

In the exemplary embodiment, the W/L ratios and the number of FETs 132 or 144 are set as suitably necessary to provide the range and resolution of the back gate bias voltage Vcc+ provided at 136 and the back gate bias voltage Vcc− provided at 148. In other embodiments, the number or sizes of any of the FETs in the first voltage reference circuit 124a or the second voltage reference circuit 124b can be selected as suitably necessary.

In the exemplary embodiment, the measured parameter P is measured by measurement system 70. If P is between $P_{MINU}$ and $P_{MINL}$, P has not changed significantly and the sense amplifiers 36 are not calibrated. If P is greater than $P_{MAXU}$ or less than $P_{MAXL}$, the value of P indicates that one or more of the operating parameters has exceeded the acceptable operating range and sense amplifiers 36 cannot be calibrated. In one embodiment, suitable data indicating that the operating parameters have exceeded the acceptable operating range and sense amplifiers 36 cannot be calibrated is stored in two or more memory cells 14. In the exemplary embodiment, reference comparator 74 provides the second indication or out of range flag at line 52 if P is greater than $P_{MAXU}$ or less than $P_{MAXL}$. If P is greater than $P_{MINU}$ and equal to or less than $P_{MAXU}$, or if P is less than $P_{MINL}$ and equal to or greater than $P_{MAXL}$, reference comparator 74 provides the first indication or calibration flag at line 50. The first indication or calibration flag at line 50 initiates calibration of the sense amplifiers 36. In one embodiment, suitable data indicating that calibration of the sense amplifiers 36 can be completed is stored in two or more memory cells 14.

What is claimed is:

1. A magnetic memory comprising:
   a sense amplifier; and
   a calibration system configured to monitor at least one operating parameter of the magnetic memory and calibrate the sense amplifier if a measured parameter corresponding to the at least one operating parameter is within a range.

2. The magnetic memory of claim 1, wherein the calibration system comprises:
   a monitor system configured to provide a first indication if the measured parameter is within the range and provide a second indication if the measured parameter is not within the range; and
   an offset calibration system configured to calibrate the sense amplifier when the monitor system provides the first indication.

3. The magnetic memory of claim 2, wherein the monitor system comprises:
   a measurement system configured to measure the measured parameter;
   a reference comparator configured to compare the measured parameter to a maximum upper value end a maximum lower value which define the range and provide the first indication if the measured parameter is equal to or greater than the maximum lower value and equal to or less than the maximum upper value and provide the second indication if the measured parameter is less than the maximum lower value or greater than the maximum upper value.

4. The magnetic memory of claim 3, wherein the range comprises a minimum upper value which is less than the maximum upper value and a minimum lower value which is greater than the maximum lower value, wherein the minimum upper value is greater than the minimum lower value, and wherein the reference comparator is configured to provide the first indication if the measured parameter is greater than the minimum upper value and equal to or less than the maximum upper value or less than the minimum lower value and equal to or greater than the maximum lower value.

5. The magnetic memory of claim 4, wherein the measured parameter comprises an oscillation period fir a ring oscillator.

6. The magnetic memory of claim 4, wherein the measured parameter comprises a voltage output of a diode circuit.

7. The magnetic memory of claim 2, wherein the offset calibration system comprises:
   a first voltage reference responsive to first data configured to provide first correction voltages to the sense amplifier; and
   a second voltage reference responsive to second data configured to provide second correction voltages to the sense amplifier.

8. The magnetic memory of claim 7, wherein the first voltage reference includes:
   a first up/down counter configured to store first offset data;
   a first first voltage divider circuit configured to provide a first first back gate bias voltage which corresponds to the first offset data; and
   a first second voltage divider circuit configured to provide a first second back gate bias voltage which corresponds to the first offset data, wherein the first correction voltages include the first first back gate bias voltage and the first second back gate bias voltage.

9. The magnetic memory of claim 8, wherein the second voltage reference includes:
   a second up/down counter configured to store second offset data;
   a second first voltage divider circuit configured to provide a second first back gate bias voltage which corresponds to the second offset data; and
   a second second voltage divider circuit configured to provide a second second back gate bias voltage which corresponds to the second offset data, wherein the second correction voltages include the second first back gate bias voltage and the second second back gate bias voltage.

10. The magnetic memory of claim 9, wherein the first offset data is equal to the second offset data.

11. The magnetic memory of claim 1, wherein one of the at least one operating parameters is a temperature of the magnetic memory.

12. The magnetic memory of claim 1, wherein one of the at least one operating parameters is a power supply voltage supplied to the magnetic memory.

13. The magnetic memory of claim 2, comprising:
    at least two memory cells; and
    a control system configured to store the first indication and the second indication in the at least two memory cells.

14. A magnetic memory comprising:
    an array of memory cells;
    an array of bit lines extending in a first direction which intersect the array of memory cells;
    an array of word lines extending in a second direction which intersect the array of memory cells;
    sense amplifiers coupled to corresponding bit lines; and
    a calibration system coupled to the sense amplifiers configured to monitor at least one operating parameter of the magnetic memory and calibrate the sense amplifiers if a measured parameter corresponding to the at least one operating parameter is within a range.

15. The magnetic memory of claim 14, wherein the calibration system comprises:
    a monitor circuit configured to provide a calibration flag if the measured parameter is within the range and provide an out of range flag if the measured parameter is not within the range; and
    offset calibration circuit configured to calibrate the sense amplifiers when the monitor circuit provides the calibration flag.

16. The magnetic memory of claim 15, wherein the monitor circuit comprises:
    a sensor configured to measure the measured parameter; and
    a reference comparison circuit configured to compare the measured parameter to a maximum upper value and a maximum lower value which define the range and provide the calibration flag if the measured parameter is equal to or greater than the maximum lower value and equal to or less than the maximum upper value and provide the out of range flag if the measured parameter is less than the maximum lower value or greater than the maximum upper value.

17. The magnetic memory of claim 14, wherein the offset calibration circuit comprises:

a first voltage reference circuit responsive to first offset data configured to adjust the first correction voltages, wherein an amount of the adjustment of the first correction voltages is determined by the first offset data; and a second voltage reference circuit responsive to second offset data configured to adjust the second correction voltages, wherein an amount of the adjustment of the second correction voltages is determined by the second offset data.

18. The magnetic memory of claim 17, wherein the first voltage reference circuit includes:

a first up/down counter circuit configured to store the first offset data;

a first first voltage divider circuit configured to provide a first first back gate bias voltage which corresponds to the first offset data; and a first second voltage divider circuit configured to provide a first second back gate bias voltage which corresponds to the first offset data, wherein the first correction voltages include the first first back gate bias voltage and the first second back gate bias voltage.

19. The magnetic memory of claim 18, wherein the second voltage reference circuit includes:

a second up/down counter circuit configured to store the second offset data;

a second first voltage divider circuit configured to provide a second first back gate bias voltage which corresponds to the second offset data; and a second second voltage divider circuit configured to provide a second second back gate bias voltage which corresponds to the second offset data, wherein the second correction voltages include the second first back gate bias voltage and the second second back gate bias voltage.

20. The magnetic memory of claim 14, wherein one of the at least one operating parameters is a temperature of the magnetic memory.

21. The magnetic memory of claim 14, wherein one of the at least one operating parameters is a power supply voltage supplied to the magnetic memory.

22. The magnetic memory of claim 15, comprising:

a control system configured to store the calibration flag and the out of range flag in the array of memory cells.

23. A calibration system for a magnetic memory, wherein the magnetic memory includes an array of memory cells and sense amplifiers coupled to the memory cells, comprising:

a monitor system configured to monitor at least one operating parameter of the magnetic memory and provide a first indication if a measured parameter corresponding to the at least one operating parameter is within a range and provide a second indication if the measured parameter is not within the range; and an offset calibration system configured to calibrate the sense amplifiers when the monitor system provides the first indication.

24. The calibration system of claim 23, wherein the monitor system comprises:

a measurement system configured to measure the measured parameter;

a reference comparator configured to compare the measured parameter to a maximum upper value and a maximum lower value which define the range and provide the first indication if the measured parameter is equal to or greater than the maximum lower value and equal to or less than the maximum upper value and provide the second indication if the measured parameter is less than the maximum lower value or greater than the maximum upper value.

25. The calibration system of claim 24, wherein the range comprises a minimum upper value which is less than the maximum upper value and a minimum lower value which is greater than the maximum lower value, wherein the minimum upper value is greater than the minimum lower value, and wherein the reference comparator is configured to provide the first indication if the measured parameter is greater than the minimum upper value and equal to or less than the maximum upper value or less than the minimum lower value and equal to or greater than the maximum lower value.

26. The calibration system of claim 25, comprising:

wherein a first voltage reference circuit comprises:

a first up/down counter circuit configured to store a first offset data;

a first first voltage divider circuit configured to provide a first first back gate bias voltage which corresponds to the first offset data; and a first second voltage divider circuit configured to provide a first second back gate bias voltage which corresponds to the first offset data, wherein the first correction voltages include the first first back gate bias voltage and the first second back gate bias voltage; and wherein a second voltage reference circuit comprises:

a second up/down counter circuit configured to store a second offset data;

a second first voltage divider circuit configured to provide a second first back gate bias voltage which corresponds to the second offset data; and a second second voltage divider circuit configured to provide a second second back gate bias voltage which corresponds to a second offset data, wherein the second correction voltages include the second first back gate bias voltage and the second second back gate bias voltage.

27. A magnetic memory comprising:

a sense amplifier; and means for monitoring at least one operating parameter of the magnetic memory and calibrate the sense amplifier if a measured parameter corresponding to the at least one operating parameter is within a range.

28. The magnetic memory of claim 27, wherein the means for monitoring comprises:

means for measuring the measured parameter and provide a first indication if the measured parameter is within the range and provide a second indication if the measured parameter is not within the range; and an offset calibration system configured to calibrate the sense amplifier when the monitor system provides the first indication.

29. A method of monitoring at least one operating parameter of a magnetic memory and calibrating a sense amplifier if a measured parameter corresponding to the at least one operating parameter is within a range, comprising:

measuring the measured parameter; and comparing the measured parameter to a maximum upper value and a maximum lower value which define the range; and calibrating the sense amplifier if the measured parameter is equal to or greater than the maximum lower value and equal to or less than the maximum upper value.

30. The method of claim 29, comprising:

providing a data invalid flag if the measured parameter is less than the maximum lower value or greater than the maximum upper value.

31. The method of claim 29, comprising:
calibrating the sense amplifier if the measured parameter is greater than a minimum upper value and equal to or less than the maximum upper value or less than a minimum lower value and equal to or greater than the maximum lower value, wherein the minimum upper value is less than the maximum upper value and the minimum lower value is greater than the maximum lower value, and wherein the minimum upper value is greater than the minimum lower value, and wherein calibrating the sense amplifier further comprises providing first correction voltages to the sense amplifier; and providing second correction voltages to the sense amplifier.

32. The magnetic memory of claim 16, wherein the range further comprises a minimum upper value which is less than the maximum upper value and a minimum lower value which is greater than the maximum lower value, wherein the minimum upper value is greater than the minimum lower value, and wherein the reference comparison circuit is configured to provide the calibration flag if the measured parameter is greater than the minimum upper value and equal to or less than the maximum upper value or less than the minimum lower value and equal to or greater than the maximum lower value.

* * * * *